United States Patent
Hebiguchi

(10) Patent No.: US 10,241,137 B2
(45) Date of Patent: Mar. 26, 2019

(54) CURRENT SENSOR HAVING ELECTROMAGNETIC SHIELD

(71) Applicant: Alps Electric Co., Ltd., Ota-ku, Tokyo (JP)

(72) Inventor: Hiroyuki Hebiguchi, Miyagi-ken (JP)

(73) Assignee: Alps Alpine Co., Ltd., Tokyo (JP)

( * ) Notice: Subject to any disclaimer, the term of this patent is extended or adjusted under 35 U.S.C. 154(b) by 253 days.

(21) Appl. No.: 15/370,488

(22) Filed: Dec. 6, 2016

(65) Prior Publication Data

US 2017/0082663 A1 Mar. 23, 2017

Related U.S. Application Data

(63) Continuation of application No. PCT/JP2015/067625, filed on Jun. 18, 2015.

(30) Foreign Application Priority Data

Jul. 7, 2014 (JP) ................................ 2014-139669

(51) Int. Cl.
*G01R 33/09* (2006.01)
*G01R 15/20* (2006.01)

(52) U.S. Cl.
CPC .......... *G01R 15/207* (2013.01); *G01R 15/20* (2013.01)

(58) Field of Classification Search
CPC ...... G01R 15/20; G01R 15/207; G01R 33/02; G01R 19/00
See application file for complete search history.

(56) References Cited

U.S. PATENT DOCUMENTS

| 8,994,365 B2 | 3/2015 | Kawaguchi |
| 2013/0015842 A1 | 1/2013 | Kawaguchi |
| 2014/0070801 A1* | 3/2014 | Tamura ................. G01R 15/20 324/244 |
| 2014/0098570 A1* | 4/2014 | Tsai ........................ H02M 3/24 363/15 |

FOREIGN PATENT DOCUMENTS

| JP | 2005/195427 | 7/2005 |
| JP | 2010-127896 | * 6/2010 ............ G01R 15/20 |
| JP | 2010/127896 | 6/2010 |
| JP | 5659389 | 12/2014 |
| WO | 2012/050048 | 4/2012 |

OTHER PUBLICATIONS

International Search Report from PCT Application No. PCT/JP2015/067625 dated Jul. 14, 2015.

* cited by examiner

*Primary Examiner* — Alesa Allgood
(74) *Attorney, Agent, or Firm* — Beyer Law Group LLP

(57) ABSTRACT

First and second magnetic detection units are disposed at positions where an S/N ratio, which is a ratio between the strength of a magnetic field generated by a current to be measured flowing through a current path and the strength of an external magnetic field, is the same. A processing unit determines a normal operation state in a case where the detection signal of the first magnetic detection unit and the detection signal of the second magnetic detection unit approximately match each other. The processing unit determines that either one of the first and second magnetic detection units has failed in a case where the detection signals do not match each other.

9 Claims, 10 Drawing Sheets

CURRENT SENSOR HAVING ELECTROMAGNETIC SHIELD

CLAIM OF PRIORITY

This application is a Continuation of International Application No. PCT/JP2015/067625 filed on Jun. 18, 2015, which claims benefit of Japanese Patent Application No. 2014-139669 filed on Jul. 7, 2014. The entire contents of each application noted above are hereby incorporated by reference.

BACKGROUND OF THE INVENTION

1. Field of the Invention

The present invention relates to a current sensor that detects a current to be measured, which flows through a current path, by detecting a magnetic field generated by the current to be measured.

2. Description of the Related Art

In recent years, a sensor using a magnetoresistive element (a GMR element or a TMR element) having a laminated structure of a fixed magnetic layer whose magnetization direction is fixed, a nonmagnetic layer, and a free magnetic layer whose magnetization direction is changed with respect to the external magnetic field has been suggested. For example, in the field of motor driving technology in electric vehicles or hybrid cars, a relatively large current is handled. Accordingly, a current sensor capable of measuring a large current in a non-contact manner has been demanded for these applications.

As such a current sensor, there is a current sensor that detects a change in the magnetic field, which is generated by the current to be measured, using a magnetic detection element.

In a current sensor disclosed in U.S. Pat. No. 8,994,365, magnetic detection units are disposed on the top and bottom surfaces of a substrate, and the sensitivity is adjusted such that the outputs of the two magnetic detection units match each other to determine the presence or absence of a failure.

In the known current sensor described above, however, an S/N ratio that is a ratio between the strength of a magnetic field generated by the current to be measured, which flows through the current path, and the strength of an external magnetic field is different between the two magnetic detection units. Accordingly, if the external magnetic field is large, failure may be determined even though there is no failure in practice since the external magnetic field is different even if the magnetic field generated by the current to be measured at the positions of the two magnetic detection units is the same. In particular, in a case where the magnetic field from the current to be measured is small, erroneous failure determination increases.

In addition, in the current sensor described above, there is a demand for miniaturization.

SUMMARY OF THE INVENTION

The invention provides a current sensor capable of accurately performing failure determination of each magnetic detection unit even under the influence of an external magnetic field in a case where a plurality of magnetic detection units detect a current to be measured.

In addition, the invention provides a current sensor that is miniaturized and can accurately perform failure determination of each magnetic detection unit.

According to a first aspect of the invention, there is provided a current sensor including: a current path configured to extend along a direction in which a current to be measured flows; an electromagnetic shield configured to surround a periphery of the current path and have an opening in a region facing a surface of the current path; and first and second magnetic detection units configured to face the current path. The second magnetic detection unit is provided at a position closer to an end of the electromagnetic shield in the direction in which the current to be measured flows than the first magnetic detection unit is. A distance between the second magnetic detection unit and the current path is shorter than a distance between the first magnetic detection unit and the current path.

According to this configuration, since the second magnetic detection unit is provided at a position closer to the end of the electromagnetic shield in the direction in which the current to be measured flows than the first magnetic detection unit is, the distance between the second magnetic detection unit and the current path is shorter than the distance between the first magnetic detection unit and the current path. For this reason, an S/N ratio, which is a ratio between the strength of a magnetic field generated by the current to be measured flowing through the current path and the strength of an external magnetic field, in the first magnetic detection unit becomes close to that in the second magnetic detection unit. Therefore, it is possible to prevent erroneous failure determination even if the external magnetic field is strong.

Preferably, the current sensor according to the aspect of the invention further includes: a first amplifier configured to amplify an output of the first magnetic detection unit; a second amplifier configured to amplify an output of the second magnetic detection unit; and a processing unit configured to determine whether or not an output amplified by the first amplifier and an output amplified by the second amplifier match each other. Preferably, a gain of the first amplifier and a gain of the second amplifier are defined such that the output amplified by the first amplifier and the output amplified by the second amplifier match each other in a case where both the first and second magnetic detection units are normally operating.

According to this configuration, since it is sufficient to determine whether or not the output amplified by the first amplifier and the output amplified by the second amplifier match each other, it is possible to detect a failure with a simple configuration.

Preferably, the current sensor according to the aspect of the invention further includes a substrate configured to face the current path and the opening within the electromagnetic shield and be located along the direction in which the current to be measured flows. Preferably, the first magnetic detection unit is provided on a surface of the substrate not facing the current path, and the second magnetic detection unit is provided on a surface of the substrate facing the current path.

According to this configuration, since the first and second magnetic detection units are provided on the same substrate, relative positional accuracy is easily secured.

Preferably, the current sensor according to the aspect of the invention further includes a substrate configured to face the current path and the opening within the electromagnetic shield, be located along the direction in which the current to be measured flows, and be inclined in a direction of the opening with respect to the current path. Preferably, the first and second magnetic detection units are provided on one surface of the substrate.

According to this configuration, since the substrate is inclined in a direction of the opening with respect to the current path, it is possible to dispose the first and second magnetic detection units on the same surface of the substrate. Therefore, manufacturing becomes easy.

In addition, according to this configuration, since the first and second magnetic detection units are provided on the same substrate, relative positional accuracy is easily secured.

Preferably, in the current sensor according to the aspect of the invention, the electromagnetic shield has a U shape, the current path is disposed along a bottom surface of the electromagnetic shield, the first and second magnetic detection units are disposed on a side closer to the opening of the electromagnetic shield than the current path is, the first magnetic detection unit is provided in vicinity of a center of the electromagnetic shield in the direction in which the current to be measured flows, and the second magnetic detection unit is provided at a position shifted from the center of the electromagnetic shield in the direction in which the current to be measured flows. According to this configuration, it is possible to reduce the size of the electromagnetic shield.

Preferably, the first and second magnetic detection units are disposed at positions where a ratio (S/N ratio) between the strength of a magnetic field generated by the current to be measured and the strength of an external magnetic field is the same. Therefore, even in a case where a large external magnetic field is applied, the influence of the external magnetic field on the output of the first magnetic detection unit is the same as the influence of the external magnetic field on the output of the second magnetic detection unit. That is, the output of the first magnetic detection unit and the output of the second magnetic detection unit are proportional to each other regardless of the size of the external magnetic field. For this reason, it is possible to perform accurate failure determination regardless of the strength of the external magnetic field.

According to a second aspect of the invention, there is provided a current sensor including: a current path configured to extend along a direction in which a current to be measured flows; an electromagnetic shield configured to surround a periphery of the current path and have an opening in a region facing a surface of the current path; a substrate configured to face the current path and the opening within the electromagnetic shield and is located along the direction in which the current to be measured flows; a first magnetic detection unit provided on one surface of the substrate; and a second magnetic detection unit provided at a position, which faces the first magnetic detection unit, on the other surface of the substrate. The first and second magnetic detection units are provided at positions shifted from a center of the electromagnetic shield in the direction in which the current to be measured flows.

According to this configuration, since the second magnetic detection unit is provided at a position facing the first magnetic detection unit on the other surface of the substrate and the first and second magnetic detection units are provided at positions shifted from the center of the electromagnetic shield in the direction in which the current to be measured flows, the S/N ratio in the first magnetic detection unit and the S/N ratio in the second magnetic detection unit become close to each other even if the S/N ratios are not completely the same. Therefore, even in a case where a large external magnetic field is applied, the influence of the external magnetic field on the output of the first magnetic detection unit becomes close to the influence of the external magnetic field on the output of the second magnetic detection unit compared with the related art. As a result, it is possible to appropriately detect the failure of the first and second magnetic detection units compared with the related art. Even in a case where the current to be measured is small and the external magnetic field is large (in a case where the S/N ratio is small), it is possible to perform accurate failure determination by reducing the difference between the influence of the external magnetic field on the output of the first magnetic detection unit and the influence of the external magnetic field on the output of the second magnetic detection unit.

In addition, according to this configuration, since the first and second magnetic detection units are provided so as to face the top and bottom surfaces of the same substrate, relative positional accuracy is easily secured.

Preferably, in the current sensor according to the aspect of the invention, the current path has a flat surface extending along the direction in which the current to be measured flows, has a rectangular cross-section, and has a larger width than a thickness.

According to the invention, in a case where a plurality of magnetic detection units detect a current to be measured, it is possible to provide a current sensor capable of accurately performing failure determination of each magnetic detection unit even under the influence of an external magnetic field.

In addition, according to the invention, it is possible to provide a current sensor that is miniaturized and can accurately perform failure determination of each magnetic detection unit.

DESCRIPTION OF THE PREFERRED EMBODIMENTS

Hereinafter, a current sensor according to an embodiment of the invention will be described.

First Embodiment

Figure 1:
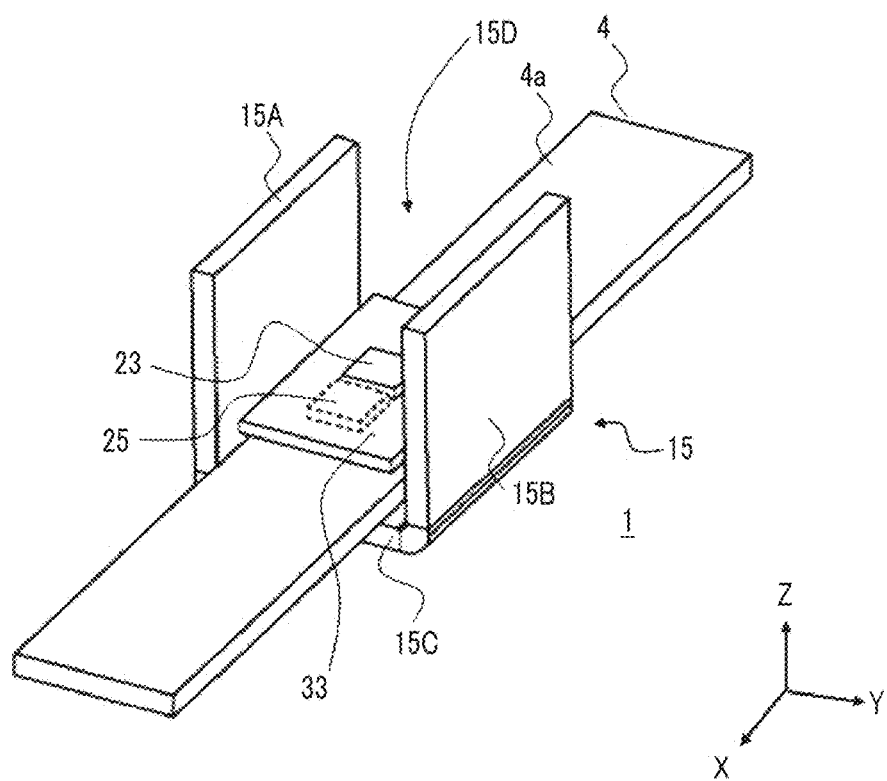
FIG. 1 is a perspective view showing the appearance of a current sensor according to an embodiment of the invention.
Figure 2:
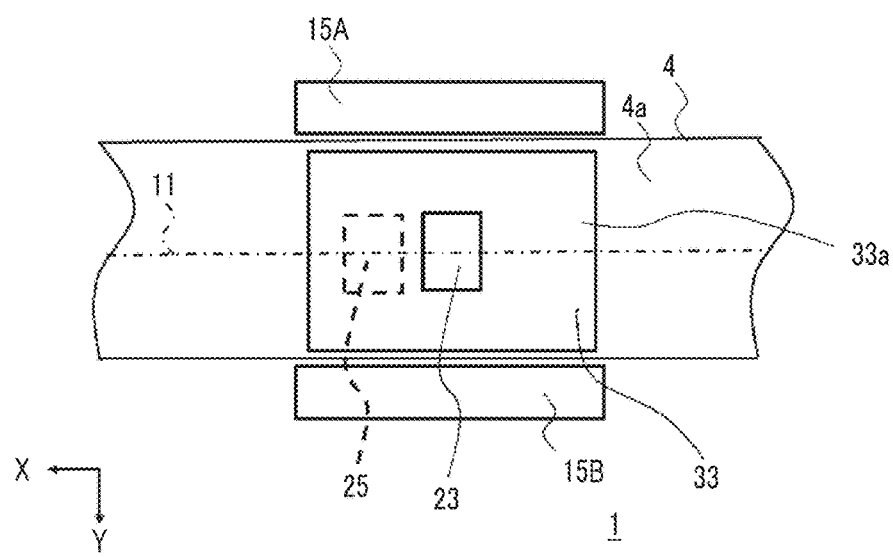
FIG. 2 is a plan view in a case where the current sensor shown in FIG. 1 is viewed from the Z direction.
Figure 3:
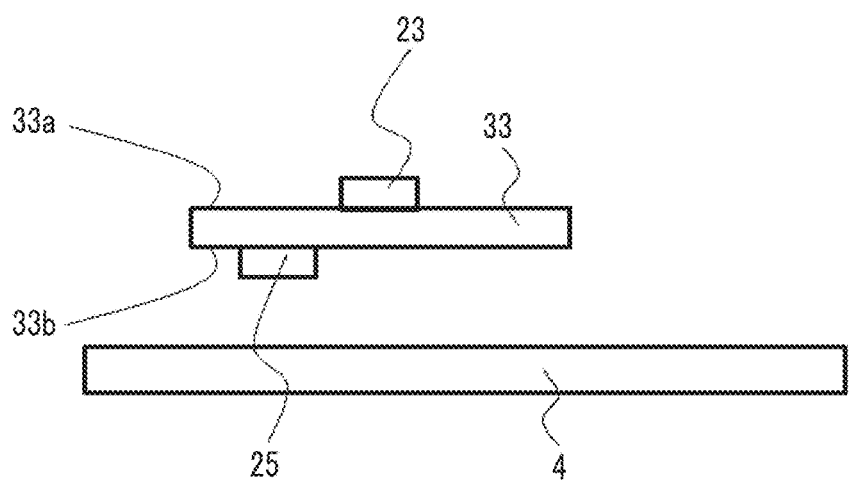
FIG. 3 is a diagram for explaining the positional relationship among a substrate, a first magnetic detection unit, and a second magnetic detection unit shown in FIG. 1 when viewed from the Y direction.

FIG. 1 is a perspective view showing the appearance of a current sensor 1 according to the embodiment of the invention. FIG. 2 is a plan view in a case where the current sensor 1 shown in FIG. 1 is viewed from the Z direction. FIG. 3 is a diagram for explaining the positional relationship among a substrate 33, a first magnetic detection unit 23, and a second magnetic detection unit 25 shown in FIG. 1 when viewed from the Y direction.

The current sensor 1 detects the current value of a current flowing through a current path 4 formed of a conductive member. In the present embodiment, the section of the current path 4 is an approximately rectangular shape in which the width (Y direction) is larger than the thickness (Z direction). The current flowing through the current path 4 is a current to be measured.

Figure 5:
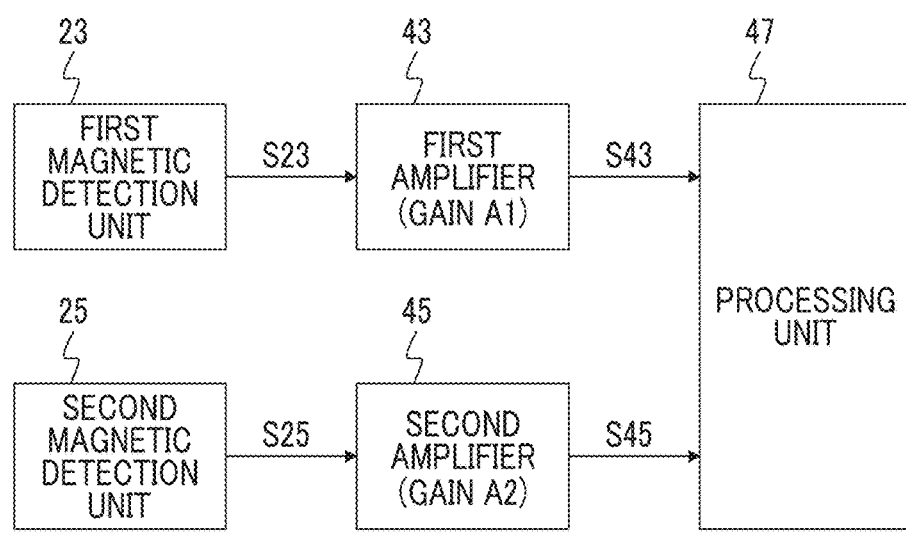
FIG. 5 is a functional block diagram of a configuration for processing outputs from the first and second magnetic detection units of the current sensor shown in FIG. 1.

As shown in FIGS. 1, 2, and 5, the current sensor 1 includes an electromagnetic shield 15, the first magnetic detection unit 23, the second magnetic detection unit 25, the substrate 33, a first amplifier 43, a second amplifier 45, and a processing unit 47, for example.

As shown in FIG. 1, in the current sensor 1, for example, the electromagnetic shield 15 integrally molded inside a resin housing (not shown) is disposed.

Inside the electromagnetic shield 15, the first and second magnetic detection units 23 and 25 are provided on the substrate 33.

Electromagnetic Shield 15

The electromagnetic shield 15 is integrally molded with a magnetic material having an approximately U-shaped section configured to include magnetic plates 15A, 15B, and 15C, and is provided with an opening 15D upward (positive side in the Z direction) inside the housing, for example.

The electromagnetic shield 15 induces a magnetic flux in a region surrounded by the magnetic plates 15A, 15B, and 15C, and has a resistance to the external magnetic field that causes disturbance. Therefore, even under the installation environment in which the influence of an external magnetic field by the presence of an adjacent current path or the like is concerned, the current sensor 1 can be used with good detection accuracy to some extent.

The magnetic plate 15C of the electromagnetic shield 15 faces a flat surface 4a of the current path 4, and is located adjacent to the flat surface 4a. The current path 4 is interposed between the magnetic plates 15A and 15B with predetermined distances from both sides in the thickness direction (Y direction). The electromagnetic shield 15 is not in contact with the current path 4.

First and Second Magnetic Detection Units 23 and 25

The first magnetic detection unit 23 is provided on a top surface (that is, a surface not facing a current path 4a) 33a of the substrate 33 in the electromagnetic shield 15, and faces the opening 15D of the electromagnetic shield 15.

The first magnetic detection unit 23 is provided in the vicinity of the center of the magnetic plate 15C in a direction (X direction) in which a current flows through the current path 4.

The second magnetic detection unit 25 is provided on a bottom surface (that is, a surface facing the current path 4a) 33b of the substrate 33 in the electromagnetic shield 15, and faces a surface 4a of the current path 4.

The second magnetic detection unit 25 is provided at a position in the electromagnetic shield 15 that is shifted by a predetermined distance in the X direction from the vicinity of the center of the magnetic plate 15C in a direction (X direction) in which a current flows through the current path 4. That is, the second magnetic detection unit 25 is provided at a position closer to the end of the electromagnetic shield 15 than the first magnetic detection unit 23 is.

As shown in FIG. 2, the center of the first magnetic detection unit 23 and the center of the second magnetic detection unit 25 are located on a centerline 11 of the current path 4 parallel to the X direction.

The first magnetic detection unit 23 detects a magnetic field at the position of the first magnetic detection unit 23, and outputs the detection signal S23 to the first amplifier 43.

The second magnetic detection unit 25 detects a magnetic field at the position of the second magnetic detection unit 25, and outputs the detection signal S25 to the second amplifier 45.

The first and second magnetic detection units 23 and 25 are disposed at positions where the S/N ratio, which is a ratio between a magnetic field strength (S) generated by the current to be measured flowing through the current path 4 and an external magnetic field strength (N), is the same.

Accordingly, the influence of the external magnetic field on the detection signal S23 is the same as the influence of the external magnetic field on the detection signal S25.

Figure 4:
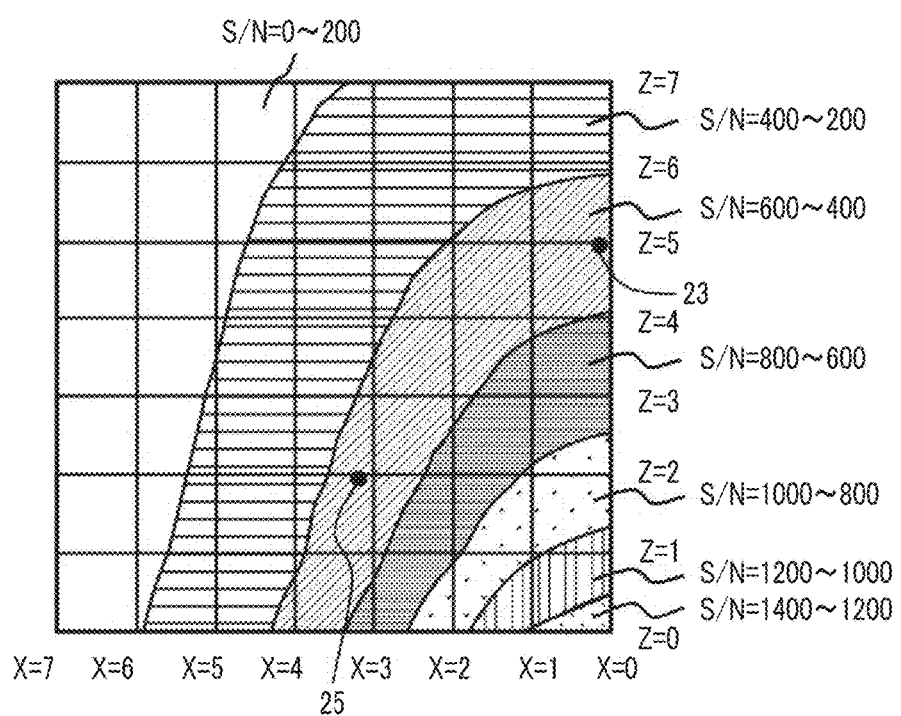
FIG. 4 is a diagram showing the S/N ratio in the X and Z directions inside an electromagnetic shield of the current sensor shown in FIG. 1.

FIG. 4 is a diagram showing the S/N ratio in the X and Z directions inside the electromagnetic shield 15 of the current sensor 1 shown in FIG. 1. The horizontal axis indicates coordinates in the X direction, and the vertical axis indicates coordinates in the Z direction. The position of X=0 mm corresponds to the center position of the magnetic plate 15C in the X direction.

The first magnetic detection unit 23 is disposed in the vicinity of (X, Z)=(0.5 mm, 5.0 mm) shown in FIG. 1.

The second magnetic detection unit 25 is disposed in the vicinity of (X, Z)=(3.2 mm, 2.0 mm).

As shown in FIG. 4, at the positions of the first and second magnetic detection units 23 and 25, each S/N ratio is in the range of 400 to 600. In addition, the S/N ratio is the same at the positions of the first and second magnetic detection units 23 and 25.

FIG. 4 shows that the S/N ratios become close if the second magnetic detection unit 25 is provided at a position closer to the end of the electromagnetic shield 15 in a direction in which a current to be measured flows than the first magnetic detection unit 23 is and the distance between the second magnetic detection unit 25 and the current path 4 is set to be shorter than the distance between the first magnetic detection unit 23 and the current path 4.

It is assumed that the S/N ratio of the invention is the same if the S/N ratio is within a fixed range, for example. The fixed range is each of ranges obtained by dividing the S/N by the width of "200", for example. The range is defined based on experiments.

As the first magnetic detection unit 23, the same thing as the second magnetic detection unit 25 is used, for example.

As the first and second magnetic detection units 23 and 25, for example, or a hall element or a magnetoresistive element (a GMR element or a TMR element) having a laminated structure of a fixed magnetic layer whose magnetization direction is fixed, a nonmagnetic layer, and a free magnetic layer whose magnetization direction is changed with respect to the external magnetic field is used. Each of the first and second magnetic detection units 23 and 25 detects a current flowing through the current path 4 based on a change in the surrounding magnetic field. That is, a desired value of a current flowing through the current path 4 is detected.

The first and second magnetic detection units 23 and 25 output the detection signals (current signals) S23 and S25 to the first and second amplifiers 43 and 45, respectively.

FIG. 5 is a functional block diagram of a configuration for processing outputs from the first and second magnetic detection units 23 and 25 of the current sensor 1 shown in FIG. 1.

First and Second Amplifiers 43 and 45

The first amplifier 43 outputs a detection signal S43, which is obtained by amplifying the detection signal S23 from the first magnetic detection unit 23 with a first gain A1, to the processing unit 47.

The second amplifier 45 outputs a detection signal S45, which is obtained by amplifying the detection signal S25 from the second magnetic detection unit 25 with a second gain A2, to the processing unit 47.

Processing Unit 47

The processing unit 47 determines a normal operation state in a case where the detection signals S43 and S45 approximately match each other.

On the other hand, the processing unit 47 determines that either one of the first and second magnetic detection units 23 and 25 has failed in a case where the detection signals S43 and S45 do not match each other.

The processing unit 47 outputs, as a measured current value, at least one of the detection signals S43 and S45 from the first and second amplifiers 43 and 45.

Hereinafter, the operation of the current sensor 1 will be described.

When a current flows through the current path 4, a magnetic field is generated around the current path 4, and a flux density B corresponding to the strength of the magnetic field occurs within the electromagnetic shield 15.

Then, the first magnetic detection unit 23 detects a magnetic field at the position of the first magnetic detection unit 23, and outputs the detection signal S23 to the first amplifier 43.

In addition, the second magnetic detection unit 25 detects a magnetic field at the position of the second magnetic detection unit 25, and outputs the detection signal S25 to the second amplifier 45.

Then, the first amplifier 43 outputs the detection signal S43, which is obtained by amplifying the detection signal S23 from the first magnetic detection unit 23 with the first gain A1, to the processing unit 47.

In addition, the second amplifier 45 outputs the detection signal S45, which is obtained by amplifying the detection signal S25 from the second magnetic detection unit 25 with the second gain A2, to the processing unit 47.

As described above, the first gain A1 of the first amplifier 43 and the second gain A2 of the second amplifier 45 are defined so that the detection signals S43 and S45 after amplification match each other in the normal state of the first and second magnetic detection units 23 and 25.

Therefore, the detection signals S43 and S45 match each other in the normal state of the first and second magnetic detection units 23 and 25.

On the other hand, in a case where at least one of the first and second magnetic detection units 23 and 25 has failed, the detection signals S43 and S45 after amplification do not match each other.

The processing unit 47 determines that the first and second magnetic detection units 23 and 25 are operating normally in a case where the detection signals S43 and S45 match each other.

On the other hand, the processing unit 47 determines that at least one of the first and second magnetic detection units 23 and 25 has failed in a case where the detection signals S43 and S45 do not match each other.

The processing unit 47 outputs, as a measured current value, at least one of the detection signals S43 and S45 from the first and second amplifiers 43 and 45.

As described above, according to the current sensor 1, the first and second magnetic detection units 23 and 25 are located at positions where the S/N ratios are approximately the same. For this reason, even in a case where a large external magnetic field is applied, the influence of the external magnetic field on the detection signal S23 of the first magnetic detection unit 23 is almost the same as the influence of the external magnetic field on the detection signal S25 of the second magnetic detection unit 25. Therefore, it is possible to appropriately detect the failure of the first and second magnetic detection units 23 and 25 based on the detection signals S43 and S45 after amplification. Even in a case where the current to be measured is small and the external magnetic field is large (in a case where the S/N ratio is small), it is possible to perform accurate failure determination by reducing the influence of the external magnetic field.

In addition, according to the current sensor 1, since a distance from the first magnetic detection unit 23 to the current path 4 is different from a distance from the second magnetic detection unit 25 to the current path 4, it is possible to reduce a distance between the first and second magnetic detection units 23 and 25 in the X direction parallel to the surface 4a of the current path 4. Therefore, it is possible to reduce the size of the current sensor 1 in the X direction.

That is, according to the current sensor 1, even in a case where noise is large, failure detection can be appropriately realized with a small configuration.

In addition, there is a plurality of magnetic detection units. Therefore, when failure is detected, it is possible to realize fail-safe control by regarding a detection signal showing a large value as a current value.

In addition, according to the current sensor 1, since the first and second magnetic detection units 23 and 25 are provided on the same substrate 33, relative positional accuracy is easily secured.

First Modification Example of the First Embodiment

Figure 6:
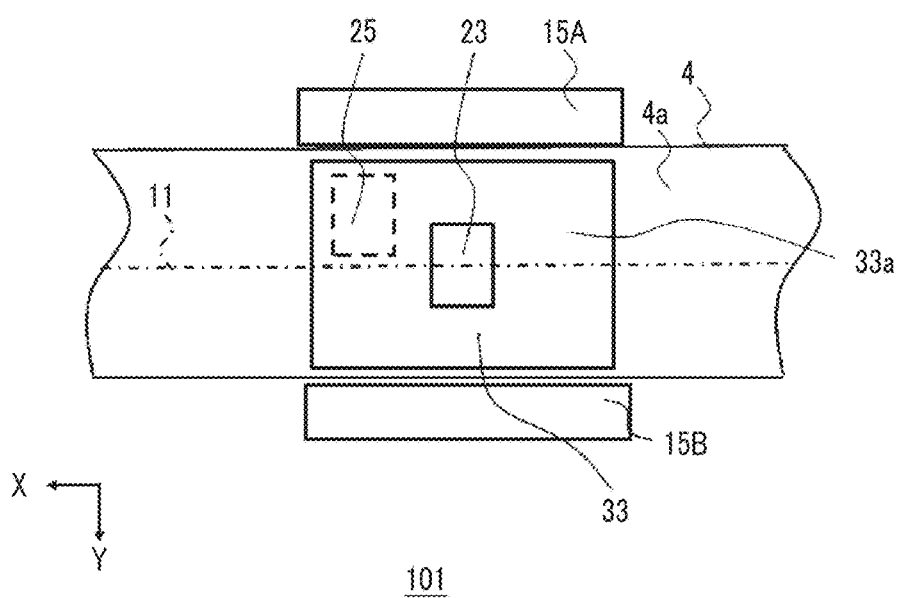
FIG. 6 is a diagram for explaining a current sensor according to a first modification example of the first embodiment of the invention.

FIG. 6 is a diagram for explaining a current sensor 101 according to a first modification example of the first embodiment of the invention.

The current sensor 101 is the same as the current sensor 1 of the first embodiment except for the Y-direction position of the second magnetic detection unit 25.

As shown in FIG. 6, in the current sensor 101, in the same manner as in the first embodiment, the first magnetic detection unit 23 is provided on the top surface 33a of the substrate 33 in the electromagnetic shield 15, and faces the opening 15D of the electromagnetic shield 15.

The first magnetic detection unit 23 is provided in the vicinity of the center of the magnetic plate 15C in a direction (X direction) in which a current flows through the current path 4.

The second magnetic detection unit 25 is provided on the bottom surface 33b of the substrate 33 in the electromagnetic shield 15, and faces the surface 4a of the current path 4. The second magnetic detection unit 25 is provided at a position in the electromagnetic shield 15 that is shifted by a predetermined distance in the X direction from the vicinity of the center of the magnetic plate 15C in a direction (X direction) in which a current flows through the current path 4.

In the current sensor 101, the first magnetic detection unit 23 is located on the centerline 11 of the current path 4 parallel to the X direction.

On the other hand, the second magnetic detection unit 25 is provided on the bottom surface 33b of the substrate 33 that is shifted by a predetermined distance in the Y direction from the centerline 11 of the current path 4.

The first and second magnetic detection units 23 and 25 are disposed at positions where the S/N ratio, which is a ratio between the magnetic field strength (S) generated by the current to be measured flowing through the current path 4 and the external magnetic field strength (N), is the same. Accordingly, the influence of the external magnetic field on the detection signal S23 is the same as the influence of the external magnetic field on the detection signal S25.

Also by the current sensor 101, the same effect as in the current sensor 1 of the first embodiment can be obtained.

Second Modification Example of the First Embodiment

Figure 7:
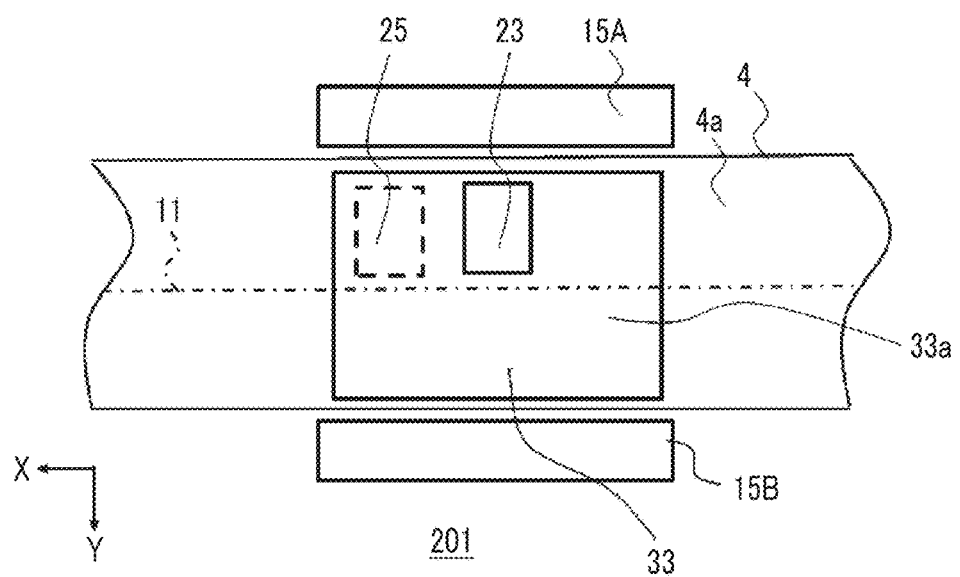
FIG. 7 is a diagram for explaining a current sensor according to a second modification example of the first embodiment of the invention.

FIG. 7 is a diagram for explaining a current sensor 201 according to a second modification example of the first embodiment of the invention.

The current sensor 201 is the same as the current sensor 1 of the first embodiment except for the Y-direction positions of the first and second magnetic detection units 23 and 25.

As shown in FIG. 7, in the current sensor 201, in the same manner as in the first embodiment, the first magnetic detection unit 23 is provided on the top surface 33a of the substrate 33 in the electromagnetic shield 15, and faces the opening 15D of the electromagnetic shield 15.

The first magnetic detection unit 23 is provided in the vicinity of the center of the magnetic plate 15C in a direction (X direction) in which a current flows through the current path 4.

The second magnetic detection unit 25 is provided on the bottom surface 33b of the substrate 33 in the electromagnetic shield 15, and faces the surface 4a of the current path 4. The second magnetic detection unit 25 is provided at a position in the electromagnetic shield 15 that is shifted by a predetermined distance in the X direction from the vicinity of the center of the magnetic plate 15C in a direction (X direction) in which a current flows through the current path 4.

In the current sensor 201, the first and second magnetic detection units 23 and 25 are provided on the top surface 33a and the bottom surface 33b of the substrate 33 that are shifted by a predetermined distance in the Y direction from the centerline 11 of the current path 4, respectively.

The first and second magnetic detection units 23 and 25 are disposed at positions where the S/N ratio, which is a ratio between the magnetic field strength (S) generated by the current to be measured flowing through the current path 4 and the external magnetic field strength (N), is the same. Accordingly, the influence of the external magnetic field on the detection signal S23 is the same as the influence of the external magnetic field on the detection signal S25.

Also by the current sensor 201, the same effect as in the current sensor 1 of the first embodiment can be obtained.

Second Embodiment

Figure 8:
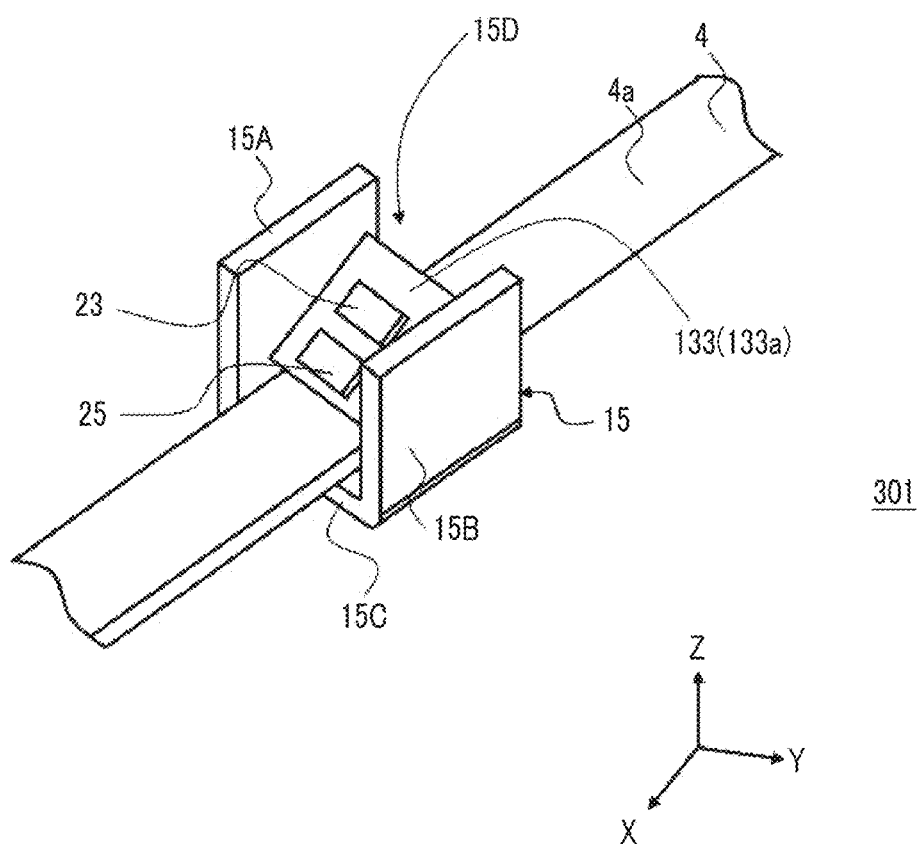
FIG. 8 is a perspective view showing the appearance of a current sensor according to a second embodiment of the invention.
Figure 9:
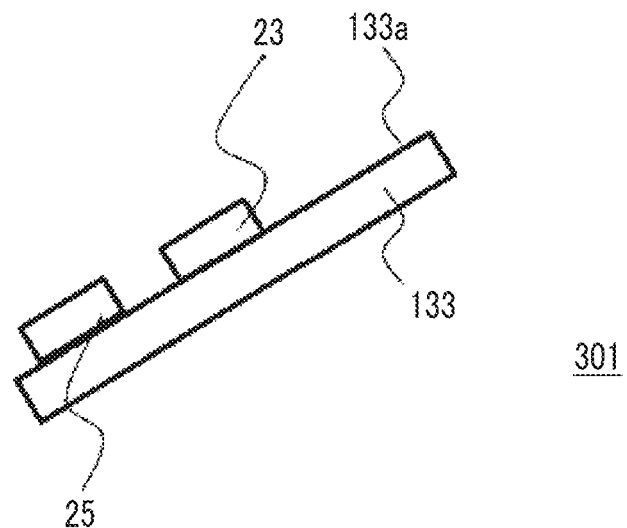
FIG. 9 is a diagram for explaining the positional relationship among a substrate, a first magnetic detection unit, and a second magnetic detection unit shown in FIG. 8 when viewed from the Y direction.

FIG. 8 is a perspective view showing the appearance of a current sensor 301 according to the embodiment of the invention. FIG. 9 is a diagram for explaining the positional relationship among a substrate 133, a first magnetic detection unit 23, and a second magnetic detection unit 25 shown in FIG. 8 when viewed from the Y direction.

As shown in FIGS. 8 and 9, in the current sensor 301, the substrate 133 is disposed so as to be inclined by a predetermined angle with respect to the surface 4a of the current path 4.

The first and second magnetic detection units 23 and 25 are provided at different X-direction positions on a top surface 133a of the substrate 133. The first and second magnetic detection units 23 and 25 are provided at different Z-direction positions. The first magnetic detection unit 23 is located at a position closer to the current path 4 than the second magnetic detection unit 25 is.

The first and second magnetic detection units 23 and 25 are disposed at positions where the S/N ratio, which is a ratio between the magnetic field strength (S) generated by the current to be measured flowing through the current path 4 and the external magnetic field strength (N), is the same. Accordingly, the influence of the external magnetic field on the detection signal S23 is the same as the influence of the external magnetic field on the detection signal S25.

Also by the current sensor 301, the same effects as in the first embodiment can be obtained.

Third Embodiment

Figure 10:
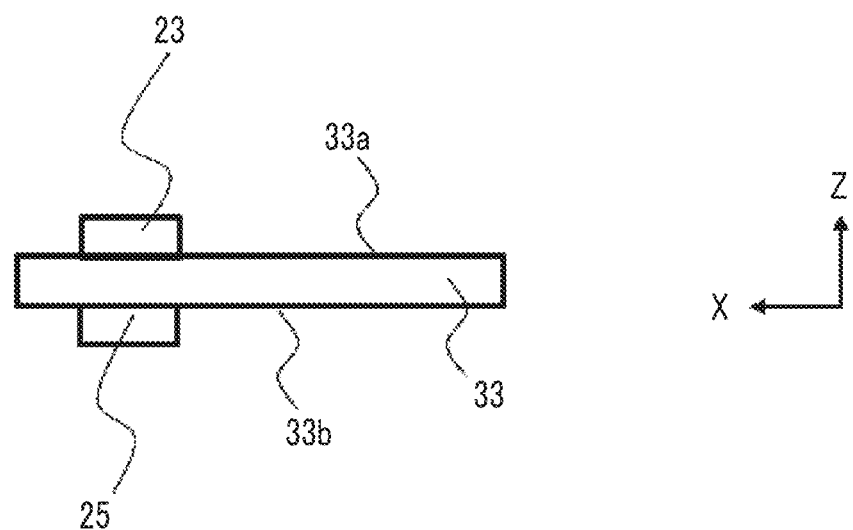
FIG. 10 is a diagram for explaining the arrangement of a substrate, a first magnetic detection unit, and a second magnetic detection unit in a current sensor according to a third embodiment of the invention when viewed from the Y direction shown in FIG. 1.
Figure 11:
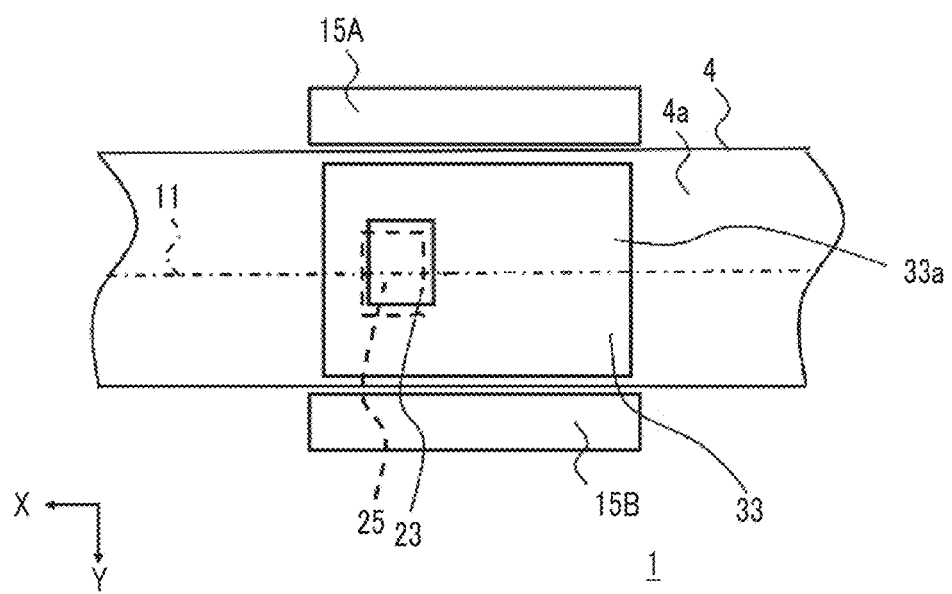
FIG. 11 is a plan view in a case where the current sensor according to the third embodiment of the invention is viewed from the Z direction shown in FIG. 1.

FIG. 10 is a diagram for explaining the arrangement of the substrate 33, the first magnetic detection unit 23, and the second magnetic detection unit 25 in a current sensor 401 according to a third embodiment of the invention when viewed from the Y direction shown in FIG. 1. FIG. 11 is a diagram for explaining the arrangement of the substrate 33, the first magnetic detection unit 23, and the second magnetic detection unit 25 in the current sensor 401 according to the third embodiment of the invention when viewed from the Z direction shown in FIG. 1.

In the current sensor 401, only the arrangement of the first magnetic detection unit 23 in the X direction is different from that in the current sensor 1 of the first embodiment.

As shown in FIG. 10, in the current sensor 401, the first magnetic detection unit 23 is provided on the top surface 33a of the substrate 33 in the electromagnetic shield 15.

In addition, the second magnetic detection unit 25 is provided on the bottom surface 33b of the substrate 33 in the electromagnetic shield 15.

The first and second magnetic detection units 23 and 25 are provided at the same position in the electromagnetic shield 15 that is shifted by a predetermined distance in the X direction from the vicinity of the center of the magnetic plate 15C in a direction (X direction) in which a current flows through the current path 4. That is, the first and second magnetic detection units 23 and 25 are located so as to face each other with the substrate 33 interposed therebetween. In FIG. 11, for convenience of illustration, the first and second magnetic detection units 23 and 25 are drawn so as to be slightly shifted from each other. In practice, when viewed from the Z direction in FIG. 1, the first and second magnetic detection units 23 and 25 are located at the overlapping position as shown in FIG. 10.

As is apparent from FIG. 4, at a position near the end that deviates from the center of the electromagnetic shield 15, a region where the S/N ratio, which is a ratio between the magnetic field strength (S) generated by the current to be measured flowing through the current path 4 and the external magnetic field strength (N), is the same is located at an approximately vertical angle. For this reason, the S/N ratio in the first magnetic detection unit 23 becomes close to the S/N ratio in the second magnetic detection unit 25. Accordingly, the influence of the external magnetic field on the detection signal S23 becomes close to the influence of the external magnetic field on the detection signal S25.

Also by the current sensor 401, the same effect as in the current sensor 1 of the first embodiment can be obtained.

The invention is not limited to the embodiments described above. That is, for the components of the embodiment described above, various changes, combinations, sub-combinations, and replacements can be made by those skilled in the art within the technical scope of the invention or within the range of its equivalents.

For example, in the embodiment described above, the processing unit 47 determines a normal operation state in a case where the detection signals S43 and S45 approximately match each other, and determines that either one of the first and second magnetic detection units 23 and 25 has failed in a case where the detection signals S43 and S45 do not match each other.

In the invention, for example, a normal operation state may be determined in a case where the detection signals S43 and S45 are proportional to each other, and it may be determined that either one of the first and second magnetic detection units 23 and 25 has failed in a case where the detection signals S43 and S45 are not proportional to each other. That is, a normal operation state is determined in a case where the detection signal S43 is a certain multiple of the detection signal S45. On the other hand, it may be determined that either one of the first and second magnetic detection units 23 and 25 has failed in a case where the detection signal S43 is not a certain multiple of the detection signal S45.

In addition, although the case where the first and second magnetic detection units 23 and 25 are disposed at two different X-direction places inside the electromagnetic shield 15 in the embodiments described above, magnetic detection units may be disposed at three different X-direction places inside the electromagnetic shield 15.

In addition, the shape of the electromagnetic shield 15 shown in the present embodiment is an example, and can be modified within the scope of the invention as defined in the appended claims.

In addition, although the sectional shape of the current path 4 is not particularly limited, it is desirable that the side of the current path 4 facing the opening 15D of the electromagnetic shield 15 is flat.

The invention can be applied to a current sensor for a vehicle or the like.

It should be understood by those skilled in the art that various modifications, combinations, sub-combinations and alterations may occur depending on design requirements and other factors insofar as they are within the scope of the appended claims of the equivalents thereof.

What is claimed is:

1. A current sensor, comprising:
a current path extending along a first direction and having a first surface extending in the first direction, a current to be measured flowing through the current path;
an electromagnetic shield surrounding the current path and having a width in the first direction between side ends, the electromagnetic shield having open ends in a direction perpendicular to the first direction so as to form an opening therebetween, the opening exposing the first surface of the current path;
a substrate disposed in the opening of the electromagnetic shield and extending along the first direction, the substrate having a lower surface facing the first surface of the current path and an upper surface opposite to the lower surface;
a first magnetic detection unit disposed at a first position on the upper surface of the substrate, the first position being apart from the first surface by a first distance;
a second magnetic detection unit disposed at a second position on the lower surface of the substrate so as to face the first surface of the current path, the second position being apart from the first surface by a second distance smaller than the first distance, wherein the second position is closer, along the first direction, to one of the side ends of the electromagnetic shield than the first position is.

2. The current sensor according to claim 1, further comprising:
a substrate disposed in the opening of the electromagnetic shield so as to align with the current path viewed from above the opening, the substrate being inclined from the first surface toward the opening with respect to the first direction,
wherein the first and second magnetic detection units are provided on an upper surface of the substrate.

3. The current sensor according to claim 1, wherein
the electromagnetic shield including a first side portion having a first end, a second side portion having a second end, and a bottom portion connecting the first and second side portions so as to form a U shape having the opening between the first end and the second end,
the current path is disposed between the first and second side portions along the bottom portion such that a second surface of the current path which is opposed to the first surface thereof faces the bottom portion,
the first and second magnetic detection units are disposed above the first surface of the current path,
the first magnetic detection unit is provided at a center of the electromagnetic shield in the first direction, and
the second magnetic detection unit is provided at a position shifted from the center of the electromagnetic shield in the first direction.

4. The current sensor according to claim 1,
wherein the first and second magnetic detection units are disposed at positions where a ratio between a strength of a magnetic field generated by the current to be measured and a strength of an external magnetic field is the same.

5. The current sensor according to claim 1, further comprising:
a first amplifier configured to amplify an output of the first magnetic detection unit with a first gain so as to output a first amplified signal;
a second amplifier configured to amplify an output of the second magnetic detection unit with a second gain so as to output a second amplified signal; and a processing unit configured to determine whether or not the first amplified signal and the second amplified signal match each other, wherein the first gain and the second gain are defined such that the first and second amplified signals match each other when both of the first and second magnetic detection units are operating normally.

6. The current sensor according to claim 1, wherein the first surface of the current path is a flat surface, and the current path has a rectangular cross-section having a width greater than a thickness thereof.

7. A current sensor, comprising:

a current path extending along a first direction and having a first surface extending in the first direction, a current to be measured flowing through the current path;

an electromagnetic shield surrounding the current path, the electromagnetic shield having open ends in a direction perpendicular to the first direction so as to form an opening therebetween, the opening exposing the first surface of the current path;

a substrate disposed in the opening of the electromagnetic shield and extending along the first direction, the substrate having a lower surface facing the first surface of the current path and an upper surface opposite to the lower surface;

a first magnetic detection unit provided on the upper surface of the substrate; and a second magnetic detection unit provided on the lower surface of the substrate at a position corresponding to that of the first magnetic detection unit such that the first and second magnetic detection unit face each other with the substrate interposed therebetween, wherein the positions of the first and second magnetic detection units are shifted from a center of the electromagnetic shield in the first direction.

8. The current sensor according to claim 7, further comprising:

a first amplifier configured to amplify an output of the first magnetic detection unit with a first gain and output a first amplified signal;

a second amplifier configured to amplify an output of the second magnetic detection unit with a second gain and output a second amplified signal; and a processing unit configured to determine whether or not the first amplified signal and the second amplified signal match each other, wherein the first gain and the second gain are defined such that the first and second amplified signals match each other when both of the first and second magnetic detection units are operating normally.

9. The current sensor according to claim 7, wherein the first surface of the current path is a flat surface, and the current path has a rectangular cross-section having width greater than a thickness thereof.

* * * * *